United States Patent
Schat

(10) Patent No.: US 10,425,068 B1
(45) Date of Patent: Sep. 24, 2019

(54) SELF-TESTING OF AN ANALOG MIXED-SIGNAL CIRCUIT USING PSEUDO-RANDOM NOISE

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 8 days.

(21) Appl. No.: 16/008,544

(22) Filed: Jun. 14, 2018

(51) Int. Cl.
*H03K 3/84* (2006.01)
*G01R 31/3167* (2006.01)
*G05F 1/46* (2006.01)
*H03F 3/45* (2006.01)

(52) U.S. Cl.
CPC .......... *H03K 3/84* (2013.01); *G01R 31/3167* (2013.01); *G05F 1/46* (2013.01); *H03F 3/45273* (2013.01)

(58) Field of Classification Search
CPC ........ H03K 3/84; G01R 31/3167; G05F 1/46; H03F 3/45273
See application file for complete search history.

(56) References Cited

U.S. PATENT DOCUMENTS

| | | | |
|---|---|---|---|
| 4,677,676 A * | 6/1987 | Eriksson | G10K 11/178 381/71.11 |
| 5,396,561 A | 3/1995 | Popovich et al. | |
| 5,423,076 A | 6/1995 | Westergren et al. | |
| 5,553,153 A | 9/1996 | Eatwell | |
| 5,940,519 A | 8/1999 | Kuo | |
| 6,339,349 B1 | 1/2002 | Rajagopalan | |
| 6,625,785 B2 | 9/2003 | Chatterjee et al. | |
| 6,992,517 B2 | 1/2006 | Weiner | |
| 2009/0268791 A1 | 10/2009 | Waheed et al. | |
| 2013/0049832 A1 | 2/2013 | Wong | |
| 2017/0194969 A1 | 7/2017 | Amaral et al. | |
| 2017/0287461 A1 | 10/2017 | Ku | |

FOREIGN PATENT DOCUMENTS

WO 201751736 A1 9/2017

OTHER PUBLICATIONS

Built-in Self-Test for stability measurement of low-dropout regulator, Jae Woong Jeong, Ender Yilmaz, LeRoy Winemberg, Sule Ozev, International Test Conference 2017, paper 1.4, in print.
Wide Bandwidth System Identification of AC System Impedances by Applying Perturbations to an Existing Converter, Daniel Martin, Enrico Santi, Adam Barkley, 2011 IEEE Energy Conversion Congress and Exposition, p. 2549-2556.

(Continued)

*Primary Examiner* — Daniel C Puentes

(57) ABSTRACT

A method embodiment includes combining a control signal of a voltage regulator circuit of an apparatus with pseudo-random noise, and using the control signal to provide an output voltage signal as attenuated by a power supply rejection ratio (PSRR) of an analog mixed-signal (AMS) circuit of the apparatus. The method further includes self-testing the AMS circuit by cross-correlating a signal indicative of the output voltage signal from the AMS circuit with the pseudo-random noise and, in response, assessing the results of the cross-correlation relative to a known threshold indicative of a performance level of the AMS circuit.

26 Claims, 7 Drawing Sheets

(56) References Cited

OTHER PUBLICATIONS

Disturbance-free BIST for Loop Characterization of DC-DC Buck Converters, Navankur Beohar; Priyanka Bakliwal; Sidhanto Roy; Debashis Mandal; Philippe Adell; Bert Vermeire; Bertan Bakkaloglu; Sule Ozev, 2015 IEEE 33rd VLSI Test Symposium (VTS), p. 1-6.

Computer-Aided Small-Signal Analysis Based on Impulse response of DC/DC Switching Power Converters D. Maksimovic, IEEE Transactions on Power Electronics, Year: 2000, vol. 15, Issue: 6, p. 1183-1191.

System Identification of Power Converters with digital control through cross-correlation methods, Botao Miao; R. Zane; D. Maksimovic IEEE Transactions on Power Electronics Year: 2005, vol. 20, Issue: 5, p. 1093-1099.

On the relationship between the CMRR or PSRR and the second harmonic distortion of operational amplifiers F. O. Eynde; P. Wambacq; W. Sansen, IEEE Journal of Solid-State Circuits, 1989, vol. 24, Issue: 6 p. 1740-1744.

On the relationship between PSRR and clock feedthrough in SC filters, P. M. Van Peteghem, IEEE Journal of Solid-State Circuits, 1988, vol. 23, Issue: 4, p. 997-1004.

A secondary path modeling technique for active noise control systems, S. M. Kuo; D. Vijayan, IEEE Transactions on Speech and Audio Processing, 1997, vol. 5, Issue: 4, p. 374-377.

A general relationship between Amplifier parameters, and its Application to PSRR improvement, Eduard Säckinger, Joseph Goette, Walter Guggenbühl, IEEE Transactions on circuits and systems, vol. 38, No. 10, Oct. 1991.

System Identification: Theory for the User, Lennard Ljung, online http://een.iust.ac.ir/profs/Poshtan/Ljung%20L%20System%20Identification%20Theory%20for%20User.pdf.

Draft international Standard, ISO/DIS 26262-11, "Road Vehicles—Functional Safety—Part 11: Guideline on application of ISO 26262 to semiconductors", ISO 2016.

Sanchez, A., "Practical Design Considerations for an All-Digital PLL in a Digital Car Radio Reception SoC", Central American and Panama Convention (CONCAPAN)IEEE 36th, Nov. 9-11, 2016.

Non-final office action dated Dec. 26, 2018 in U.S. Appl. No. 16/041,027.

Notice of Allowance dated May 7, 2019 in U.S. Appl. No. 16/041,027.

\* cited by examiner

SELF-TESTING OF AN ANALOG MIXED-SIGNAL CIRCUIT USING PSEUDO-RANDOM NOISE

OVERVIEW

Aspects of various embodiments are directed to apparatuses and methods thereof that involve self-testing an analog mixed-signal (AMS) circuit of the apparatus using a pseudo-random noise.

AMS circuits have analog and digital circuitry and are used for various applications. Some applications can be associated with safety-sensitive implementations, such as standards which can require AMS parameters to be within various limits, and can require that the AMS parameters remain within the various limits over the life of the circuit.

These and other matters have presented challenges to self-testing of AMS circuit implementations, for a variety of applications.

SUMMARY

Various example embodiments are directed to issues such as those addressed above and/or others which may become apparent from the following disclosure concerning self-testing a power supply rejection ratio (PSRR) of an analog mixed-signal (AMS) circuit by adding pseudo-random noise to the supply voltage input so that the pseudo-random noise, attenuated by the PSRR of the AMS circuit, appears at the output of the AMS circuit.

In certain example embodiments, aspects of the present disclosure involve self-testing the AMS circuit of an apparatus subsequent to production testing and/or while the apparatus is in the field. The self-testing can occur at each power-up of the apparatus, at periodic intervals, and/or continuously (e.g., current with the application mode of the apparatus).

In a more specific example embodiment, a method for self-testing an AMS circuit includes combining a control signal of a voltage regulator circuit of an apparatus with a pseudo-random noise, and using the control signal combined with the pseudo-random noise to provide an output voltage signal as attenuated by a PSRR of an AMS circuit of the apparatus. The pseudo-random noise can be generated via a noise generation circuit of the apparatus and a signal control circuit can combine the pseudo-random noise with the control signal. The control signal combined with the pseudo-random noise can be provided to the AMS circuit via a voltage regulator circuit and is processed by the AMS circuit by outputting a voltage signal as attenuated by the PSRR of the AMS circuit. The voltage regulator circuit can regulate the supply voltage input based on the control signal to provide a voltage signal to the AMS circuit, which is processed by the AMS circuit to provide an output voltage signal. In various embodiments, the output voltage signal from the AMS circuit is converted to a digital signal using an analog-to-digital converter (ADC) circuit and then cross-correlated, however, embodiments are not so limited.

The method further includes self-testing the AMS circuit by cross-correlating a signal indicative of the output voltage signal from the AMS circuit with the pseudo-random noise and, in response, assessing the results of the cross-correlation relative to a known threshold indicative of a performance level of the AMS circuit. The cross-correlation can be used to determine one or more AMS parameters. Example AMS parameters include PSRR, power consumption, common mode rejection ratio, frequency response, gain of a component of the AMS circuit, distortion of a component of the AMS circuit, steepness of a filter of the AMS circuit, and a phase error of a component of the filter. For example, the cross-correlation can be used to determine an impulse response of the AMS circuit (e.g., impulse response to changes of the supply voltage). Using the impulse response, PSRR can be determined. As a specific example, the cross-correlation is used to determine a curve of the PSRR as a function of the frequency and a measure of merit of the PSRR. An area under the PSRR curve as the function of the frequency can be used to determine at least one additional AMS parameter.

In a number of specific embodiments, one or more actions can be performed based on the self-testing of the AMS circuit. For example, the assessment of the cross-correlation can indicate a circuit failure. In response to the indication of circuit failure, an action can be performed based on the failure, such as rerunning the self-test, providing an error message, rebooting the apparatus, powering the apparatus down, and various combinations thereof.

In another specific example embodiment, an apparatus includes a signal control circuit, a voltage regulator circuit, an AMS circuit, and a correlation circuit. The signal control circuit provides a (revised) control signal by combining a control signal of the voltage regulator circuit with a pseudo-random source carrying pseudo-random noise. The control signal is used to combine the supply voltage input with the pseudo-random noise by regulating the supply voltage input. As described above, the apparatus can further include a noise generator circuit that provides the pseudo-random noise. The signal control circuit inputs the control signal to the voltage regulator circuit to create changes in the output voltage of the voltage regulator circuit (as provided to the AMS circuit). The pseudo-random noise is also provided to the correlation circuit. The voltage regulator circuit outputs a voltage signal based on the control signal and the AMS circuit processes the voltage signal from the voltage regulator circuit by outputting a voltage signal as attenuated by the PSRR of the AMS circuit. The correlation circuit self-tests the AMS circuit by cross-correlating a signal indicative of the voltage signal from the AMS circuit with the pseudo-random noise. In various embodiments, the signal indicative of the voltage signal from the AMS circuit is a digital signal provided by an ADC circuit, which converts the voltage signal from the AMS circuit to the digital signal.

In accordance with a number of embodiments, the self-testing of the AMS circuit is conducted when the apparatus is in the field. The self-testing of the AMS circuit can occur concurrently with processing of the application signal, at each power-up of the apparatus, periodically (concurrently or not with processing the application signal), and/or continuously. In some embodiments, such as when the application signal is processed concurrently with the self-testing of the AMS circuit, at least a portion of the pseudo-random noise is removed from the output voltage signal as provided as an output from the apparatus using a previously generated pseudo-random noise. The amount of the previously generated pseudo-random noise can be determined and used to remove the at least portion of the (next) pseudo-random noise.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
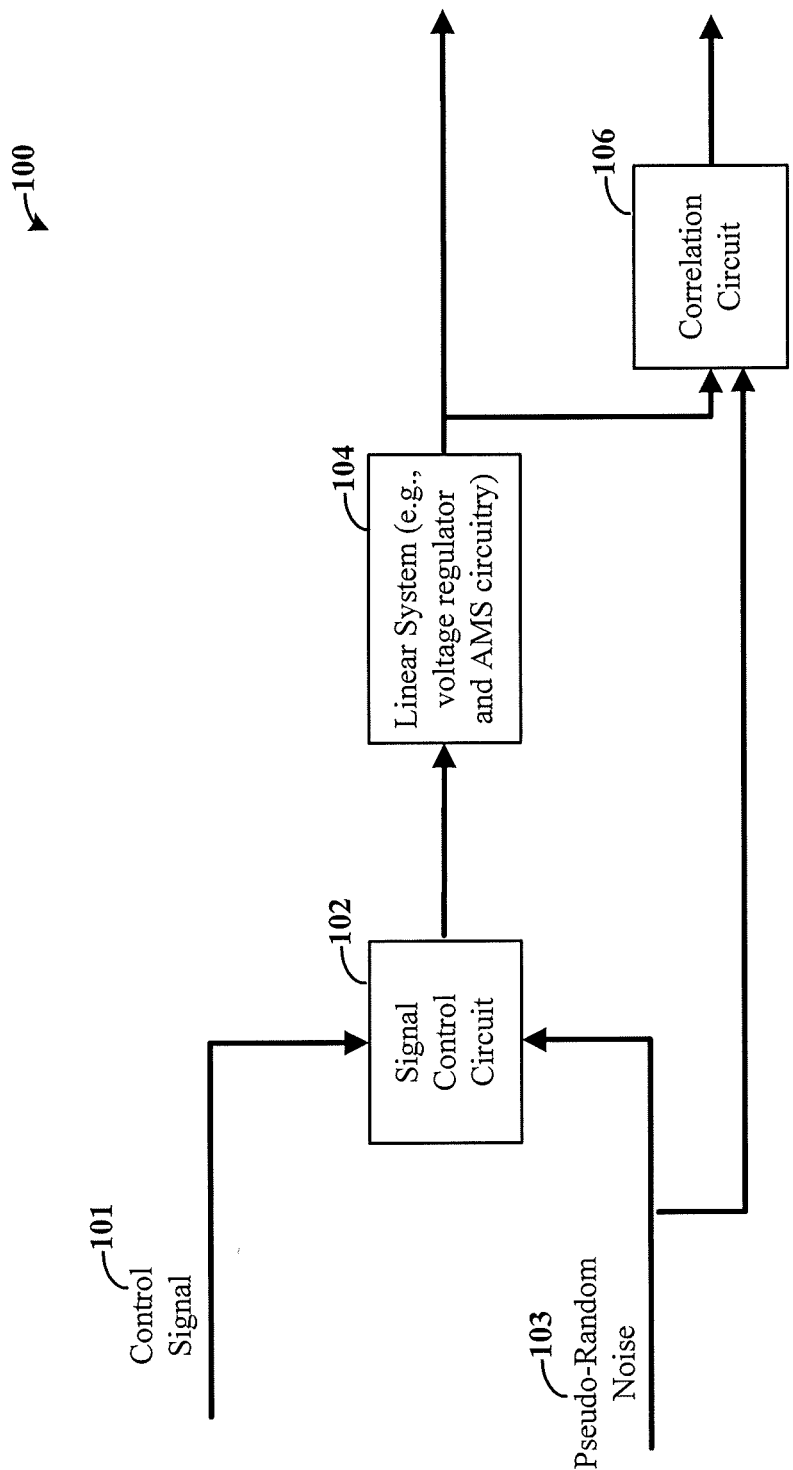
FIG. 1 illustrates an example apparatus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving self-testing of an AMS circuit by combining a pseudo-random noise with the supply voltage input of the apparatus. In certain implementations, aspects of the present disclosure have been shown to be beneficial when used in the context of adding the pseudo-random noise to a control signal of a voltage regulator circuit of the apparatus coupled to the AMS circuit, such that the pseudo-random noise, as attenuated by the power supply rejection ration (PSRR), appears at the output voltage signal of the AMS circuit. In some embodiments, the output voltage signal of the AMS circuit is digitized and cross-correlated with the pseudo-random noise to assess a performance level of the AMS circuit while the apparatus is in the field. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

AMS circuits are modules, e.g., as components of integrated circuits or built-up discrete circuits, that contain some analog components and may also contain digital components. AMS circuits are used for a variety of purposes in apparatuses, such as used in automobiles and cellular telephones. The output voltage of an AMS circuit can be designed to not be influenced by changes, including small changes, of the supply voltage. However, often AMS circuits are influenced by the changes of the supply voltage, which is described by the PSRR. PSRR directly influences performance of the AMS circuit. Additionally, a number of other AMS performance-related parameters correlate with PSRR such that determining PSRR provides an indication of the performance (e.g., sanity) of an AMS circuit. For safety-sensitive integrated circuits, such as in automobiles, it can be beneficial to measure PSRR during the lifetime of the apparatus as performance parameters can change over time due to defects and/or aging of circuitry. Embodiments in accordance with the present disclosure include apparatuses and methods for self-testing the AMS circuit using a built-in self-test (BIST). The self-testing of the AMS circuit can be performed at each power-up of the apparatus, periodically, or continuously (e.g., concurrent with the application mode). Self-testing concurrently with the application mode can allow for detection of spurious faults, sometimes referred to as Single Event Upsets (SEUs). Some standards can mandate detection of SEUs and/or mandate proving a sufficient diagnostic coverage of SEUs. The self-testing of the AMS circuit, as further described herein, can provide for a straightforward manner of providing diagnostic coverage.

An apparatus in accordance with various embodiments includes a signal control circuit, linear circuitry, and a correlation circuit. The linear circuitry can include a voltage regulator circuit and an AMS circuit, for example. The signal control circuit combines a control signal of the voltage regulator circuit with a pseudo-random noise source carrying pseudo-random noise. In various embodiments, the apparatus further includes a noise generator circuit that provides the pseudo-random noise and the pseudo-random noise is also provided to the correlation circuit, as further described herein. The signal control circuit can input the control signal combined with the pseudo-random noise to the voltage regulator circuit to create changes in the output voltage of the voltage regulator circuit as provided to the AMS circuit. The AMS circuit processes the voltage signal from the voltage regulator circuit by outputting a voltage signal as attenuated by the PSRR of the AMS circuit. The correlation circuit can self-test the AMS circuit by cross-correlating a signal indicative of the voltage signal from the AMS circuit with the pseudo-random noise. The signal indicative of the voltage signal from the AMS circuit can be a digital signal provided by an analog-to-digital converter (ADC) circuit, which converts the voltage signal from the AMS circuit to the digital signal.

The correlation circuit self-tests the AMS circuit by assessing the results of the cross-correlation relative to a known threshold indicative of a performance level of the AMS circuit. For example, the correlation circuit derives an impulse response of the AMS circuit from the cross-correlation and determines the PSRR of the AMS circuit using the derived impulse response.

Self-testing of the AMS circuit, in specific embodiments, can include combining a control signal of a voltage regulator circuit of the apparatus with pseudo-random noise. The pseudo-random noise can be generated via a noise generation circuit of the apparatus and a signal control circuit can combine the pseudo-random noise with the control signal of the voltage regulator circuit. The control signal combined with the pseudo-random noise is used to provide an output voltage signal as attenuated by a PSRR of an AMS circuit of the apparatus. The output voltage signal is provided to the AMS circuit via a voltage regulator circuit and is processed by the AMS circuit by outputting a voltage signal as attenuated by the PSRR of the AMS circuit. The voltage regulator circuit can regulate the supply voltage input based on the control signal and provides a voltage signal to the AMS circuit, which is processed by the AMS circuit as provided above. The control signal refers to or includes a control input of the voltage regulator circuit, which can be set to a fixed level or to a level that is determined during the start-up (and then stays). In a regime of Dynamic Voltage and Frequency Scaling (DVFS), the control signal can change periodically, such as once per second, which is slower compared to the pseudo-random noise in the kHz or MHz range. For example, the control signal combined with the pseudo-random noise can be used for changing a selection of transistors configured for controlling a variable resistor network in a voltage generator of the voltage regulator circuit, and the voltage regulator circuit provides the output voltage signal to the AMS circuit. The AMS circuit is self-tested by cross-correlating a signal indicative of the output voltage signal from the AMS circuit with the pseudo-random noise, and in response, assessing the results of the cross-correlation to a known threshold indicative of a performance level of the AMS circuit.

In accordance with a number of embodiments, the self-testing is conducted after production testing, such as when the apparatus is in the field. The self-testing of the AMS circuit can occur concurrently with processing of the application signal, at each power-up of the apparatus, periodically, and/or continuously. In some embodiments, such as when the application signal is processed concurrently with self-testing of the AMS circuit, at least a portion of the pseudo-random noise can be removed from the output voltage signal as provided as an output from the apparatus using a previously generated pseudo-random noise. The amount of the previously generated pseudo-random noise can be determined and used to remove the at least portion of the (next) pseudo-random noise, although embodiments are not so limited.

The cross-correlation can be used to determine one or more AMS parameters. Example parameters include PSRR, power consumption, common mode rejection ratio, frequency response, gain of a component of the AMS circuit, distortion of the component of the AMS circuit, steepness of a filter of the AMS circuit, and/or phase error of a component of the filter. For example, the cross-correlation is used to determine an impulse response of the AMS circuit (e.g., impulse response to changes of the supply voltage). Using the impulse response, PSRR can be determined. As an example, the cross-correlation can be used to determine a curve of the PSRR as a function of the frequency and a measure of merit of the PSRR. An area under the PSRR curve as function of the frequency can then be used to determine at least one additional AMS parameter.

In a number of specific embodiments, one or more actions can be performed based on the self-testing of the AMS circuit in response to the assessment indicating a circuit failure. In response to the indication of circuit failure, the apparatus can perform an action based on the failure, such as rerunning the self-test, providing an error message, rebooting the apparatus, powering the apparatus down, and various combinations thereof.

Turning now to the figures, FIG. 1 illustrates an example apparatus, in accordance with the present disclosure. The apparatus 100 can self-test an AMS circuit that forms part of the apparatus 100 using a pseudo-random noise 103 for determining a PSRR, which is used to assess the performance level of the AMS circuit. PSRR on the one hand is a parameter that shall be sufficiently high for many applications to guarantee the required performance. On the other hand, PSRR correlates with a number of other such parameters, like 2nd order harmonics, clock feedthrough, slew rate, supply current, large-signal gain and common-mode rejection ratio. For such reasons, continuously supervising the PSRR can be beneficial to detect performance degradation in real-time. The pseudo-random noise 103 is applied to the control signal 101 of the linear system 104 and also provided to correlation circuit 106. As further described herein, the linear system 104 outputs a signal that is attenuated by PSRR to the correlation circuit 106 and the correlation circuit 106 cross-correlates the output from the linear system 104 with the pseudo-random noise 103 for estimating linear system parameters.

As illustrated by FIG. 1, the apparatus 100 includes a signal control circuit 102 that combines the pseudo-random noise 103 with the supply voltage input via a control signal 101 of a voltage regulator circuit. The supply voltage input can be provided during an application mode or during a self-test (only) mode, as further described herein. The signal control circuit 102 provides the control signal combined with the pseudo-random noise to the linear system 104. The linear system 104 includes voltage regulator and AMS circuits, in various specific embodiments and as further described herein. The linear system 104 processes the control signal and provides an output signal that can be used to derive system parameters.

The correlation circuit 106 cross-correlates the two inputs provided, which include the pseudo-random noise 103 and the output from the linear system 104. In response, the correlation circuit 106 assesses the results of the cross-correlation relative to a known threshold indicative of a performance level of the linear system 104. In specific embodiments, the correlation circuit 106 self-tests an AMS circuit by cross-correlating a signal indicative of the output voltage signal from the AMS circuit with the pseudo-random noise 103 and, in response, assesses the results of the cross-correlation relative to a known threshold indicative of a performance level of the AMS circuit.

The cross-correlation can be defined as:

$$r_{xy}(\tau) = \int_{-\infty}^{\infty} x(t) y(t+\tau) dt.$$

With x(t) and y(t) being the two signals to be correlated, and τ being the delay between the two signals. For time-discrete signals, the cross-correlation can be expressed by:

$$r_{xy}(m) = \Sigma_{n=1}^{\infty} x(n) * y(n+m).$$

If x(t) is pseudo-random noise 103 (e.g., from a noise generator) that is fed to the input of a linear system 104, and y(t) is the output of this linear system 104, then $r_{xy}(t)$ is the impulse response of the linear system 104 (e.g., the AMS circuit). This impulse response can be directly evaluated in the time domain, to derive the transfer function of the linear system 104 under consideration, namely the AMS circuit. It can also be Fourier-transformed to analyze the linear system 104 in the frequency domain. The cross-correlation can be applied while the linear system 104 is processing application signals by adding the pseudo-random noise 103 to the control signal 101. Because the answer of the linear system 104 to the application signal is not correlated to the pseudo-random noise 103, it does not influence the result of the cross-correlation. Thus, parameter estimation of the linear system 104 can be done during the application mode. In such embodiments, care is taken such that the noise is mitigated or prevented from influencing the application. If the additional noise is not tolerable in the application, then the noise can be added during dedicated self-test intervals, when the application is switched off. Alternatively, as is further illustrated and described below, the added pseudo-random noise 103 can be subtracted from the output signal of the linear system 104.

As further illustrated herein, the apparatus 100 can include various additional components. Example components include a voltage regulator circuit, AMS circuit, noise generator circuit, an ADC circuit, among other components.

Figure 2:
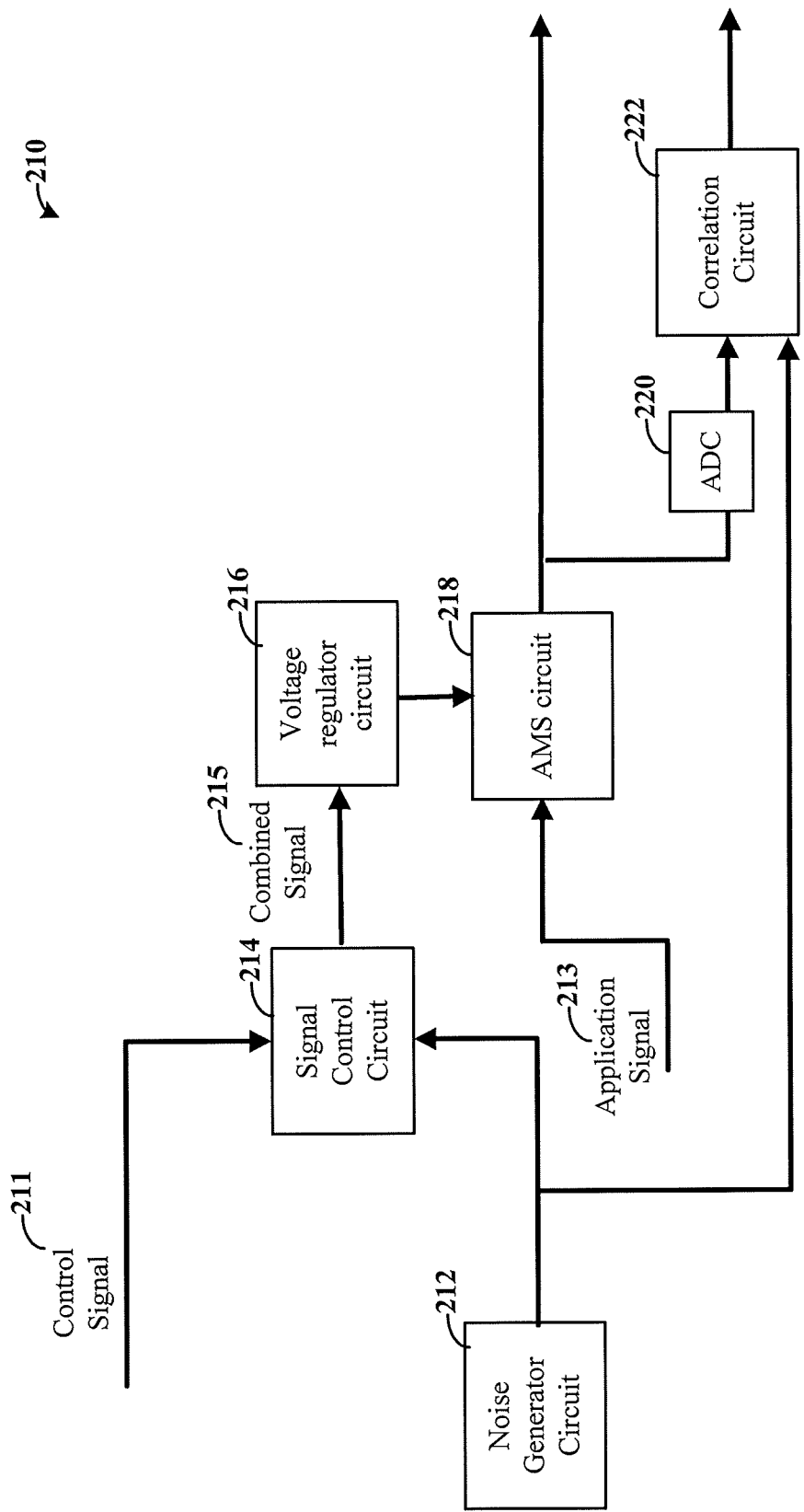
FIG. 2 illustrates an example apparatus, in accordance with the present disclosure.

FIG. 2 illustrates an example apparatus, in accordance with the present disclosure. FIG. 2 can include the apparatus illustrated by FIG. 1, with additional components separately illustrated. The apparatus 210 includes the previously-described signal control circuit 214, correlation circuit 222, and a linear system that includes a voltage regulator circuit 216 and an AMS circuit 218.

In various embodiments, the apparatus 210 includes a noise generator circuit 212. The noise generator circuit 212 provides a pseudo-random noise source carrying the pseudo-random noise. The pseudo-random noise source refers to or includes a signal that carries the pseudo-random noise. For example, the pseudo-random noise source is provided to both the signal control circuit 214 and the correlation circuit 222 for determining AMS circuit parameters. An example noise generator circuit 212 can include a linear feedback shift register (LFSR), however embodiments are not so limited.

As previously described, the signal control circuit 214 combines the pseudo-random noise with the control signal 211. The signal control circuit 214 circuit is coupled to the voltage regulator circuit 216 and inputs the control signal combined with the pseudo-random noise to the voltage regulator circuit 216 to create changes in the output voltage of the voltage regulator circuit 216. The output voltage of the voltage regulator circuit 216, such as an LDO, is thereby controlled by the pseudo-random noise, e.g., using the trimming bits of the voltage regulator circuit 216. The voltage regulator circuit 216 outputs a voltage signal based on the input control signal combined with the pseudo-random noise (e.g., the combined signal 215) and the supply voltage input and is used, for instance, to regulate the supply voltage input. For example, the voltage regulator circuit 216 can include a variety of circuitry such as various linear voltage regulators. The voltage regulator circuit 216 uses the input control signal combined with the pseudo-random noise (e.g., the combined signal 215) for changing a selection of transistors, thereby controlling a variable resistor network in a voltage regulator of the voltage regulator circuit. In some specific embodiments, the voltage regulator circuit 216 includes a programmable voltage generator configured with configurable (e.g., software-programmable) bits that are changed in response to the control signal combined with the pseudo-random noise (e.g., the combined signal 215), for changing a selection of transistors for controlling a variable resistor network.

The voltage regulator circuit 216 provides the output voltage signal to the AMS circuit 218. The AMS circuit 218 processes the voltage signal from the voltage regulator circuit 216 by outputting a voltage signal as attenuated by the PSRR of the AMS circuit 218. The AMS circuit, in specific embodiments, has two pairs of field effect transistors arranged vertically between supply rails and that are configured to provide a differential amplifier.

A signal indicative of the voltage signal from the AMS circuit 218 is provided to the correlation circuit 222. In addition, the voltage signal from the AMS circuit 218 is provided as or used as part of an output for the apparatus 210. In various embodiments, as illustrated by FIG. 2, an ADC circuit 220 is arranged between the AMS circuit 218 and the correlation circuit 222 and to provide the signal indicative of the voltage signal from the AMS circuit 218 by converting the voltage signal to a digital signal and providing the digital signal to the correlation circuit 222.

The correlation circuit 222 self-tests the AMS circuit 218 by cross-correlating the signal indicative of the voltage signal from the AMS circuit 218 (e.g., the digital signal from the ADC circuit 220) with the pseudo-random noise as provided by the noise generator circuit 212. The correlation circuit 222 can be running on an on-chip central processing unit (CPU), in specific embodiments, and is coupled to both the AMS circuit 218 and the noise generator circuit. Generally, the correlation circuit 222 can be digital, however, embodiments are not so limited. For example, in some embodiments, an analog correlation circuit is present. An analog correlation circuit can be limited in precision, as it may only allow for correlation for one value of $\tau$ at a time, such that the correlation procedure is performed successively for a larger number of values of $\tau$.

The cross-correlation can be performed using the above-provided example algorithms. For example, the cross-correlation can be based on a delay between the inputs to the correlation circuit 222, namely the signal indicative of the voltage signal from the AMS circuit 218 and the pseudo-random noise. In specific embodiments, an impulse response of the AMS circuit 218 is derived from the cross-correlation, and used to determine the PSRR of the AMS circuit 218. The results of the cross-correlation can be assessed by the correlation circuit 222 relative to a known threshold. The known threshold can be indicative of a performance level of the AMS circuit. For example, the threshold can include one or more PSRR values that indicate circuit failure, SEUs, and/or guarantee the required performance. As an example, the PSRR value or other AMS parameters can be compared against constant limits, or gradual changes to detect aging, such as due to negative-bias temperature instability (NBTI).

In various embodiments, as described above, the cross-correlation (e.g., impulse response) is used to determine a curve of the PSRR as a function of the frequency and a measure of merit of the PSRR. An area under the PSRR curve as the function of the frequency can be used to determine one or more additional AMS parameters. Example AMS parameters include power consumption, common mode rejection ratio, frequency response, gain of a component of the AMS circuit, distortion of the a component of the AMS circuit, steepness of a filter of the AMS circuit, phase error of a component of the filter, and various combinations thereof. Additionally, in a number of more specific embodiments, one or more actions can be performed by the apparatus 100 in response to the cross-correlation being indicative of a circuit failure, as further described herein.

The apparatus 210 can self-test the AMS circuit 218 at different times. In some embodiments, the correlation circuit 222 self-tests the AMS circuit 218 continuously and/or concurrently with the AMS circuit 218 processing an application signal 213, and in other embodiments, the correlation circuit 222 self-tests the AMS circuit 218 in response to an initiation of a power-up of the apparatus 210 and/or periodically after the power-up. For embodiments in which the self-test is concurrent (whether continuous or periodic) with processing of the application signal 213, and for specific applications, the increased noise on the output of the apparatus, due to the pseudo-random noise added, may disturb the application. In such embodiments, at least a portion of the pseudo-random noise can be removed from the output using a determined noise level from a previous pseudo-random noise, as further described herein.

The above describes different operational modes, e.g., intermittent and concurrent modes, for self-testing the AMS circuit 218 and which can be used for different applications. An intermittent mode can include adding the pseudo-random noise signal only when the AMS circuit 218 is not needed by the application. This may be the case if the test is only executed at the power-up, or in regular intervals when the application mode is suspended for a time, or concurrent to self-test of other modules of the integrated circuit, e.g., when the application is interrupted. The intermittent mode provides the advantage that the original AMS signal quality is preserved, however, SEUs may not be easily detected. A concurrent mode includes adding the pseudo-random noise signal the power supply during operation, which can include continuous and/or periodic testing. This increases the noise level at the output of the AMS circuit 218. Due to the increased noise, the concurrent mode may be performed on applications that have low requirements for the noise level. This is often the case if the noise level is allowed to be, for example, 40 to 60 dB below the application signal 213, thus high enough to perform a cross-correlation, but low enough to not disturb the application. The concurrent mode provides the advantage of detecting faults in real time, especially SEUs (also known as transient faults). Detecting these SEUs can be mandated by various standards, such as ISO 26262, moreover this standard requires a certain Diagnostic Coverage. Proving that this Diagnostic Coverage is met is not easy, and having a described self-test improves proving a sufficient Diagnostic Coverage.

Figure 3:
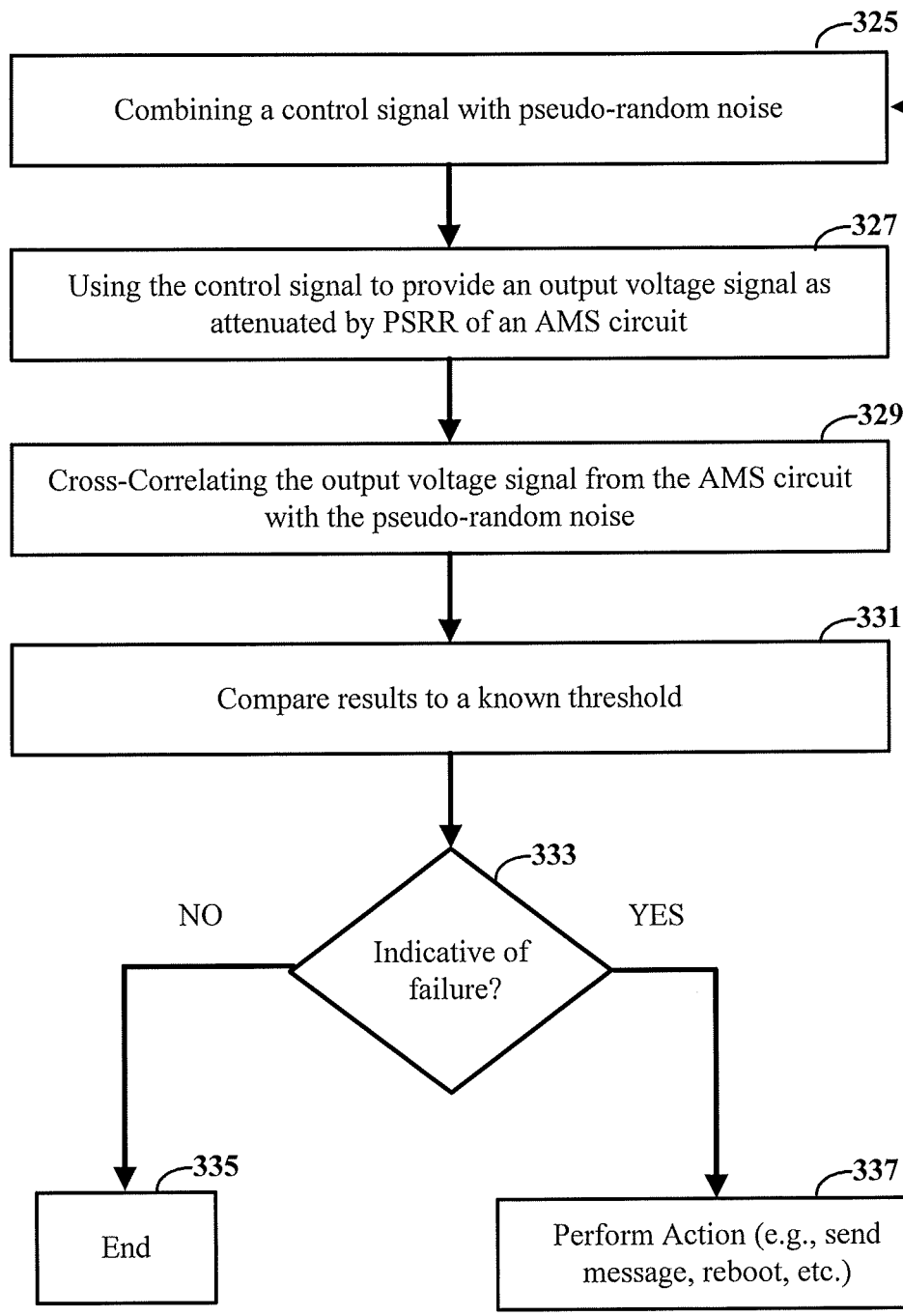
FIG. 3 is a flow chart illustrating an exemplary set of activities and/or data flow for an apparatus of the type implemented in a manner consistent with FIGS. 1-2, in accordance with the present disclosure.

FIG. 3 is a flow chart illustrating an exemplary set of activities and/or data flow for an apparatus of the type implemented in a manner consistent with FIGS. 1-2, in accordance with the present disclosure. At 325, the method includes combining a control signal of a voltage regulator circuit of an apparatus with pseudo-random noise. As previously described, the pseudo-random noise can be generated via a noise generation circuit of the apparatus and combined with the control signal via a signal control circuit of the apparatus.

At 327, the method includes using the control signal combined with the pseudo-random noise to provide an output voltage signal as attenuated by a PSRR of an AMS circuit of the apparatus. In various specific embodiments, the input supply voltage is regulated by a voltage regulator of the apparatus to provide the output voltage signal to the AMS circuit based on the control signal combined with the pseudo-random noise. The control signal is used, for example, to create changes in the output voltage of the voltage regulator circuit, which are then provided to the AMS circuit to derive impulse responses of the AMS circuit. The output voltage signal or a signal indicative of the output voltage signal is provided to correlation circuitry. In a number of embodiments, the output voltage is converted to a digital signal using an ADC circuit of the apparatus.

The method further includes self-testing the AMS circuit by cross-correlating a signal indicative of the output voltage signal from the AMS circuit with the pseudo-random noise, at 329, and, in response, assessing the results of the cross-correlation relative to a known threshold indicative of a performance level of the AMS circuit, at 331. As described above, the cross-correlation can be used to derive the impulse response of the AMS circuit, and which is used to determine one or more AMS parameters. For example, a PSRR curve as a function of the frequency and/or measure of merit of the PSRR curve as the function of the frequency can be determined from the cross-correlation. Additionally, the area under the PSRR curve can be used to determine one or more additional AMS parameters, such as power consumption, common mode rejection ratio, frequency response, gain of a component of the AMS circuit, distortion of the a component of the AMS circuit, steepness of a filter of the AMS circuit and/or phase error of a component of the filter. One or more of the AMS parameters can be compared to respective thresholds to determine a performance level of the AMS circuit.

In accordance with various embodiments, the apparatus can perform one or more actions in response to the comparison of the results to one or more thresholds indicating a circuit failure. For example, at 333, a determination can be made as to whether the results of the cross-correlation indicate circuit failure. If not, at 335, the process can end until the next self-test. In response to an indication of a circuit failure, at 337, one or more actions can be performed. The actions can include rerunning the self-test, providing an error message, rebooting the apparatus, powering the apparatus down, and various combinations thereof.

Figure 4:
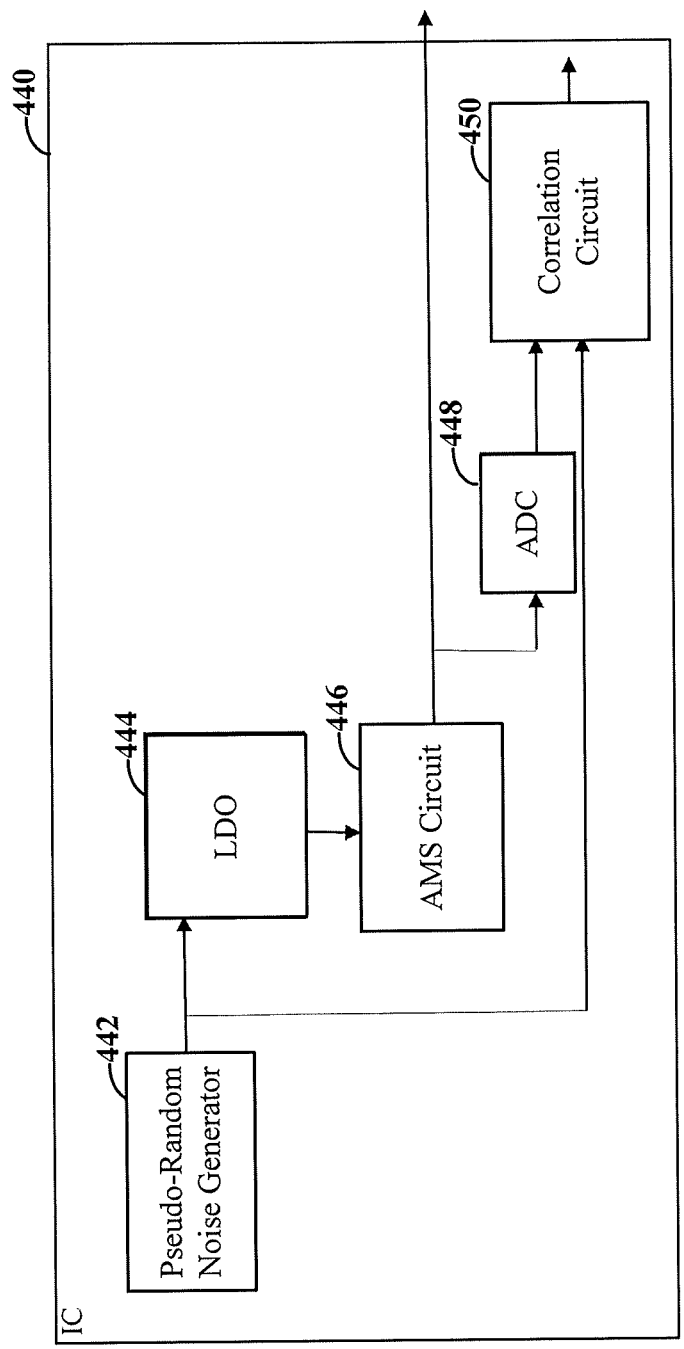
FIG. 4 illustrates an example apparatus, in accordance with the present disclosure.

FIG. 4 illustrates an example apparatus, in accordance with the present disclosure. The apparatus can include the apparatus previously illustrated and described by FIG. 2. For example, as illustrated, the apparatus includes a noise generator circuit, e.g., the pseudo-random noise generator 442, a voltage regulator circuit, e.g., the LDO 444, an AMS circuit 446, ADC circuit 448, and correlator circuit 450 all integrated on an integrated circuit 440, such as previously described in connection with FIG. 2.

A pseudo-random noise generator 442 generates a pseudo-random noise, such as a binary random white noise sequence with a data rate of, for example one Mbit/s. In specific embodiments, this bit stream is injected at the control input of the LDO 444 to create small changes, e.g., 0.1%-2%, of the LDO output voltage. This LDO output voltage is the supply voltage of the AMS circuit 446. The output voltage of the AMS circuit 446 is converted to a digital signal by the ADC circuit 448 and then fed into the correlator circuit 450. The correlator circuit 450 may be realized preferably by a CPU which is already on-board in many AMS integrated circuits, such as in Systems-On-Chips (SOCs).

Figure 5:
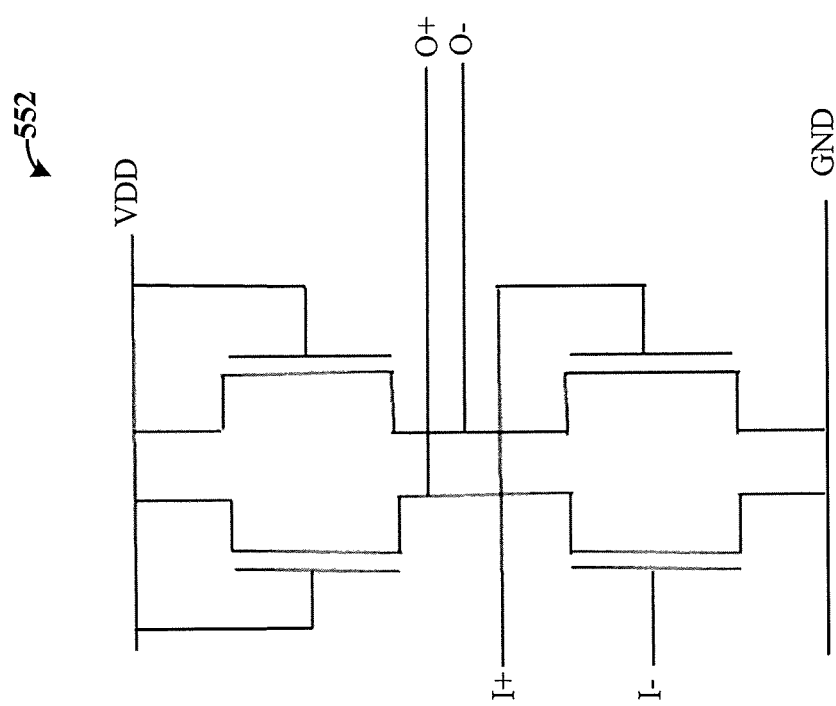
FIG. 5 illustrates an example AMS circuit of an apparatus, in accordance with the present disclosure.

FIG. 5 illustrates an example AMS circuit of an apparatus, in accordance with the present disclosure. More specifically, FIG. 5 shows an example of a CMOS circuit 552 of a simple analog differential amplifier, with differential inputs I+ and I−, and differential outputs O+ and O−, supplied by a positive supply VDD against ground GND.

In this circuit, there are many marginal defects possible that affect the PSRR, but also other parameters like common-mode supply rejection ratio (CMRR), while functionality is still given, but with worsened parameters. Such defects include marginal change of bias voltage, saturation current etc. of any of the four transistors, caused, e.g., by NBTI, hot carrier injection (HCI), dielectric weakness, high-ohmic additional resistance, caused by high-ohmic defects like particles, between any of the nodes I+, I−, O+, O−, and any of the nodes I+, I−, O+, O−, GND, VDD. Other example defects include additional capacitance, caused by particles that still leave a small gap between the two nodes they (nearly) connect, between any of the nodes I+, I−, O+, O−, and any of the nodes I+, I−, O+, O−, GND, VDD.

Figure 6:
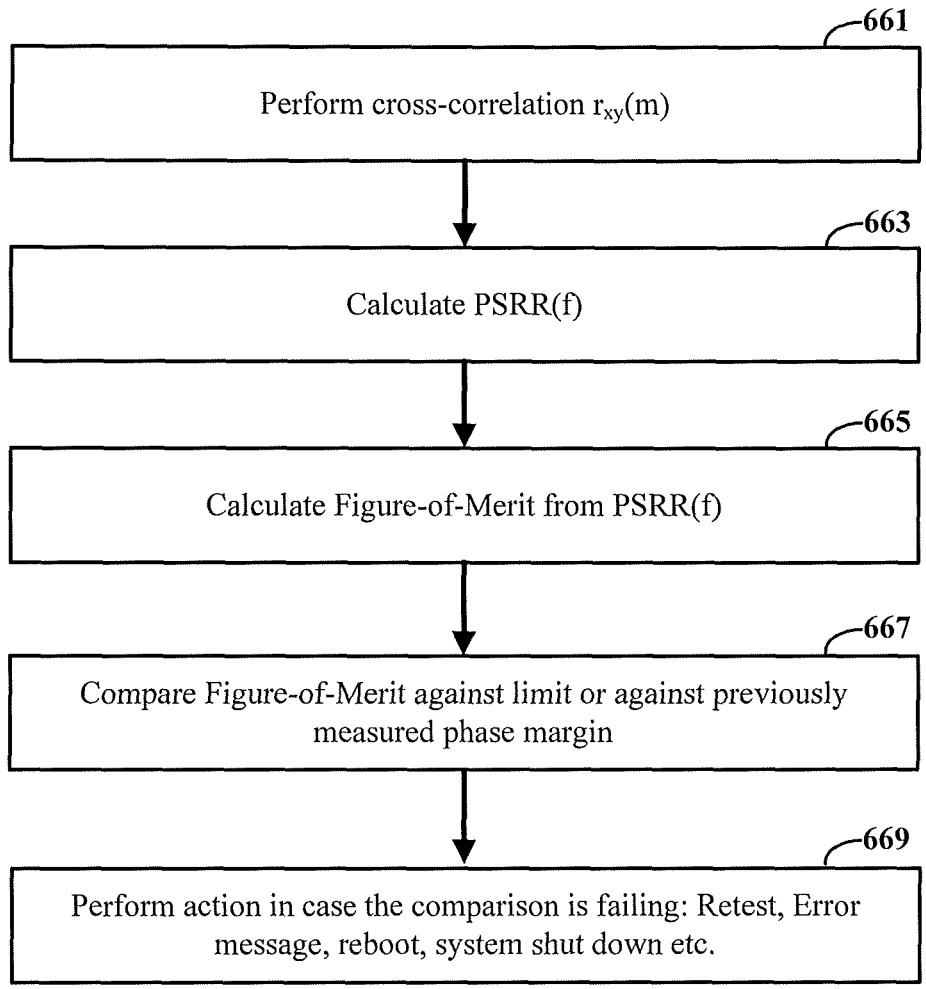
FIG. 6 illustrates an example of a process for self-testing an AMS circuit of an apparatus, in accordance with the present disclosure.

FIG. 6 illustrates an example of a process for self-testing an AMS circuit of an apparatus, in accordance with the present disclosure. For example, the basic flow illustrated by FIG. 6 is from the cross-correlation, at 661, to an action to be performed in case the result indicates a complete or marginal AMS failure, at 669. The method includes the task of calculating PSRR(f), at 663, and calculating a figure of merit from the PSRR(f), at 665. The figure of merit can be used to express the PSRR that is a function of the frequency, by a single number. This can be done by calculating the area under the PSRR(f) curve. At 667, the figure of merit is compared against a limit or a previously measured value of the figure of merit. And, at 669, in response to the comparison indicating a circuit failure, an action is performed.

Figure 7:
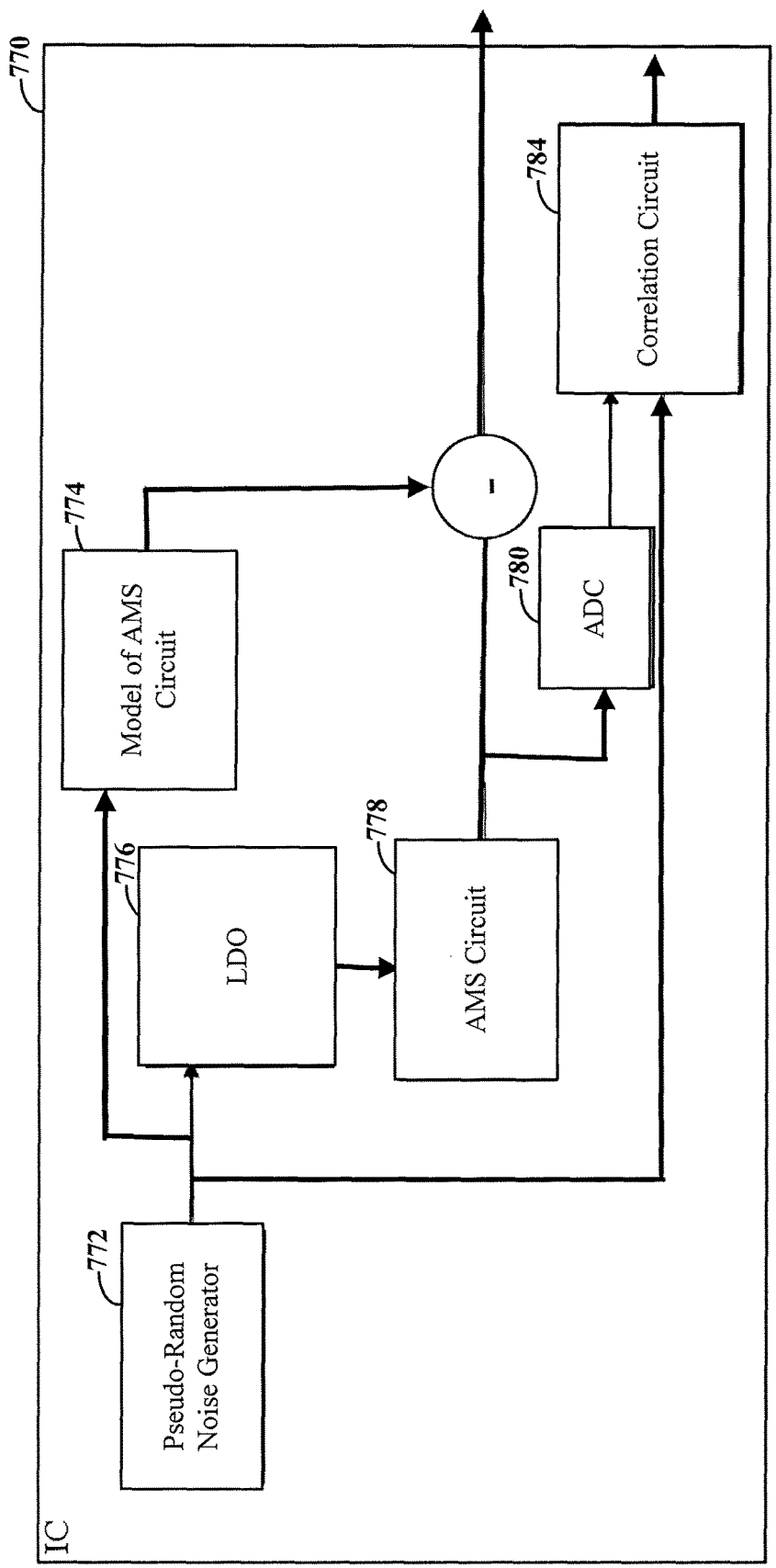
FIG. 7 illustrates an example apparatus, in accordance with the present disclosure.

FIG. 7 illustrates an example apparatus, in accordance with the present disclosure. The apparatus can include the apparatus previously illustrated and described by FIG. 2. For example, as illustrated, the apparatus include a noise generator circuit, e.g., the pseudo-random noise generator 772, a voltage regulator circuit, e.g., the LDO 776, an AMS circuit 778, an ADC circuit 780, and a correlator circuit 784 all integrated on an integrated circuit 770 and/or built-up with discrete components, such as previously described in connection with FIG. 2.

In various embodiments of the present disclosure, the added pseudo-random noise can be subtracted from the output signal of the AMS circuit 778 after passing a software-implemented model of the AMS circuit 778. The transfer characteristic of this model, e.g., the transfer characteristic of the AMS circuit 778, is known from a previous parameter estimation using the pseudo-random noise. By this means, the additional noise level at the AMS output can be substantially reduced, albeit at the expense of additional computation effort. As illustrated by FIG. 7, the apparatus can include circuitry 774 used to model the AMS circuit 778. The circuitry 774 can include a software-implemented model that is processed by processing circuitry. The circuitry 774 can be used to determine the previous pseudo-random noise estimation and model the current pseudo-random noise using the previous pseudo-random noise estimation. The pseudo-random noise (or at least a portion thereof) can be subtracted from the voltage signal output provided by the AMS circuit 778 as provided as an output by the integrated circuit.

As previously described, various safety standards can mandate measuring performance parameters in the field. As a specific example, automotive safety standards can require a certain Failure In Time (FIT) level. FIT refers to the number of safety-sensitive failures per $10^9$ operating hours that may not exceed a certain limit. Integrated circuit manufacturers may need to provide evidence that circuitry keeps a FIT level, which can be based on process reliability data showing how many defects may occur over a lifetime, and data of the functional safety concept showing how many of these defects are safety-sensitive, and how many of the safety-related defects can be mitigated by functional safety measures. The limit for safety-related defects can be very tight. As examples, it can be 100 FIT for ASIL B and 10 FIT for ASIL D. These rates refer to a complete system. However, each integrated circuit is allowed to have only a fraction of this failure rate. In a typical car radar integrated circuit (IC) or IC chip (qualified for ASIL B; only the silicon considered, not the package), the standards can require as little as 2 FIT.

Moreover, as noted above, integrated circuits sometimes fail during operation in the field—either due to aging mechanisms like NBTI, HCI and time dependent dielectric breakdown (TDDB), but also due to latent defects that are activated during the lifetime. Incidents like voltage spikes in a thunderstorm or customer mishandling (e.g., electrostatic discharge (ESD) overstress during maintenance or repair) are relevant causes of integrated circuit failures in the field. Often, a partial, i.e., parametric, failure can be more severe than a complete failure. For example, a complete failure can be immediately recognized and counter-acted, while a parametric failure may not. Embodiments in accordance with the present disclosure can allow for testing the parameters of AMS circuit by a BIST, which can allow for complying with the requirements of standards and identifying failures over the life time of the circuitry.

More specifically, apparatuses in accordance with the present disclosure can be used for production testing, validation, as well as for repeated self-test in the field, e.g., for functional checks. The details depend largely on the existing on-chip infrastructure and the requirements. For example, in all three modes (e.g., concurrent, intermittent at power-up, intermittent periodically), a test against fixed limits can be performed for the calculated figure-of-merit. In various embodiments, no fixed test limits may be used, but the PSRR can be compared against the PSRR of identical AMS circuit in the same integrated circuit. Also, the apparatus can be used to store the determined PSRR and comparing it against the PSRR determined after accelerated aging tests (e.g., in the course of validation) or after a certain operating time (e.g., during life time in the field) can performed to detect slow changes of parameters.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, circuit and/or other circuit-type depictions (e.g., reference numerals 216 and 446 of FIGS. 2 and 4 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 3 and 6. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at FIGS. 3 and 6 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the apparatus illustrated by FIG. 1 can include the noise generator circuit 212 and/or the ADC circuit 220 illustrated by FIG. 2. As another example, the apparatus illustrated by FIGS. 1 and 2 can include the LDO illustrated by FIG. 4 as the voltage regulator circuit. Such modifications do not depart from the true spirit and scope of various aspects of the disclosure, including aspects set forth in the claims.

What is claimed is:

1. A method comprising:
combining a control signal of a voltage regulator circuit of an apparatus with pseudo-random noise;
using the control signal to provide an output voltage signal as attenuated by a power supply rejection ratio (PSRR) of an analog mixed-signal (AMS) circuit of the apparatus;
converting the output voltage signal from the AMS circuit to a digital signal using an analog-to-digital converter of the apparatus; and
self-testing the AMS circuit by cross-correlating a signal indicative of the output voltage signal from the AMS circuit with the pseudo-random noise and, in response, assessing results of the cross-correlation relative to a known threshold indicative of a performance level of the AMS circuit.

2. The method of claim 1, further including processing an application signal of the apparatus using the AMS circuit concurrently with the self-testing of the AMS circuit.

3. The method of claim 1, further including generating the pseudo-random noise via a noise generation circuit of the apparatus and combining the pseudo-random noise with the control signal via a signal control circuit of the apparatus.

4. The method of claim 1, further including using the cross-correlation to determine an AMS parameter selected from the group consisting of: PSRR, power consumption, common mode rejection ratio, frequency response, gain of a component of the AMS circuit, distortion of a component of the AMS circuit, steepness of a filter of the AMS circuit, phase error of a component of the filter, and combinations thereof.

5. The method of claim 1, further including regulating an input supply voltage, via the voltage regulator circuit, using the control signal to provide the output voltage signal.

6. The method of claim 1, further including determining a pseudo-random noise previously generated by the apparatus and removing at least a portion of the pseudo-random noise from the output voltage signal as provided as an output from the apparatus using the previously generated pseudo-random noise.

7. The method of claim 1, further including using the control signal for changing a selection of transistors configured for controlling a variable resistor network in a voltage generator of a voltage regulator circuit, the voltage regulator circuit being configured and arranged to provide the output voltage signal to the AMS circuit.

8. The method of claim 1, further including using the cross-correlation to determine a curve of the PSRR as a function of the frequency and a measure of merit of the PSRR.

9. The method of claim 8, further including using an area under the PSRR curve as the function of the frequency to determine at least one additional AMS parameter.

10. The method of claim 1, further including, in response to the cross-correlation being indicative of a circuit failure, performing an action based on the failure, the action being selected from the group consisting of: rerunning the self-test, providing an error message, rebooting the apparatus, powering the apparatus down, and a combination thereof.

11. An apparatus comprising:
a signal control circuit configured and arranged to provide a first control signal by combining a pseudo-random noise source carrying pseudo-random noise with a second control signal;
a voltage regulator circuit configured and arranged to output a voltage signal based on the first control signal;
an analog mixed-signal (AMS) circuit configured and arranged to process the voltage signal from the voltage regulator circuit by outputting a voltage signal as attenuated by a power supply rejection ration (PSRR) of the AMS circuit; and
a correlation circuit configured and arranged to self-test the AMS circuit in response to an initiation of a power-up of the apparatus or periodically after the power-up and by cross-correlating a signal indicative of the voltage signal from the AMS circuit with the pseudo-random noise, and, in response, by assessing results of the cross-correlation relative to a known threshold indicative of a performance level of the AMS circuit.

12. The apparatus of claim 11, wherein the correlation circuit is configured and arranged to self-test the AMS circuit concurrently with the AMS circuit processing an application signal, and the cross-correlation is based on a delay between the signal indicative of the voltage signal from the AMS circuit and the pseudo-random noise.

13. The apparatus of claim 11, wherein the signal control circuit is configured and arranged to input the first control signal to the voltage regulator circuit to create changes in the voltage signal of the voltage regulator circuit.

14. The apparatus of claim 11, further including an analog-to-digital converter (ADC) circuit configured and arranged to provide the signal indicative of the voltage signal from the AMS circuit to the correlation circuit by converting the voltage signal to a digital signal.

15. The apparatus of claim 11, wherein the correlation circuit is configured and arranged to derive an impulse response of the AMS circuit from the cross-correlation, and determine the PSRR of the AMS circuit using the derived impulse response.

16. The apparatus of claim 11, wherein the AMS circuit includes two pairs of field effect transistors arranged vertically between supply rails and configured and arranged to provide a differential amplifier.

17. The apparatus of claim 11, further including a noise generator circuit configured and arranged to provide the pseudo-random noise source.

18. The apparatus of claim 11, wherein the voltage regulator circuit includes a programmable voltage generator configured with configurable bits that are changed in response to the first control signal, for changing a selection of transistors configured for controlling a variable resistor network.

19. A method comprising:
combining a control signal of a voltage regulator circuit of an apparatus with pseudo-random noise;
using the control signal to provide an output voltage signal as attenuated by a power supply rejection ratio (PSRR) of an analog mixed-signal (AMS) circuit of the apparatus;
using the control signal for changing a selection of transistors configured for controlling a variable resistor network in a voltage generator of a voltage regulator circuit, the voltage regulator circuit being configured and arranged to provide the output voltage signal to the AMS circuit; and
self-testing the AMS circuit by cross-correlating a signal indicative of the output voltage signal from the AMS circuit with the pseudo-random noise and, in response, assessing results of the cross-correlation relative to a known threshold indicative of a performance level of the AMS circuit.

20. A method comprising:
combining a control signal of a voltage regulator circuit of an apparatus with pseudo-random noise;
using the control signal to provide an output voltage signal as attenuated by a power supply rejection ratio (PSRR) of an analog mixed-signal (AMS) circuit of the apparatus;
self-testing the AMS circuit by cross-correlating a signal indicative of the output voltage signal from the AMS circuit with the pseudo-random noise and, in response, assessing results of the cross-correlation relative to a known threshold indicative of a performance level of the AMS circuit; and
using the cross-correlation to determine a curve of the PSRR as a function of the frequency and a measure of merit of the PSRR.

21. A method comprising:
combining a control signal of a voltage regulator circuit of an apparatus with pseudo-random noise;
using the control signal to provide an output voltage signal as attenuated by a power supply rejection ratio (PSRR) of an analog mixed-signal (AMS) circuit of the apparatus;
self-testing the AMS circuit by cross-correlating a signal indicative of the output voltage signal from the AMS circuit with the pseudo-random noise and, in response, assessing results of the cross-correlation relative to a known threshold indicative of a performance level of the AMS circuit;
using the cross-correlation to determine a curve of the PSRR as a function of the frequency and a measure of merit of the PSRR; and
using an area under the PSRR curve as the function of the frequency to determine at least one additional AMS parameter.

22. A method comprising:
combining a control signal of a voltage regulator circuit of an apparatus with pseudo-random noise;
using the control signal to provide an output voltage signal as attenuated by a power supply rejection ratio (PSRR) of an analog mixed-signal (AMS) circuit of the apparatus;
self-testing the AMS circuit by cross-correlating a signal indicative of the output voltage signal from the AMS circuit with the pseudo-random noise and, in response, assessing results of the cross-correlation relative to a known threshold indicative of a performance level of the AMS circuit; and
in response to the cross-correlation being indicative of a circuit failure, performing an action based on the failure, the action being selected from the group consisting of: rerunning the self-test, providing an error message, rebooting the apparatus, powering the apparatus down, and a combination thereof.

23. An apparatus comprising:
a signal control circuit configured and arranged to provide a first control signal by combining a pseudo-random noise source carrying pseudo-random noise with a second control signal;
a voltage regulator circuit configured and arranged to output a voltage signal based on the first control signal;
an analog mixed-signal (AMS) circuit configured and arranged to process the voltage signal from the voltage regulator circuit by outputting a voltage signal as attenuated by a power supply rejection ration (PSRR) of the AMS circuit; and
a correlation circuit configured and arranged to self-test the AMS circuit by cross-correlating a signal indicative of the voltage signal from the AMS circuit with the pseudo-random noise, and, in response, by assessing results of the cross-correlation relative to a known threshold indicative of a performance level of the AMS circuit; and
an analog-to-digital converter (ADC) circuit configured and arranged to provide the signal indicative of the voltage signal from the AMS circuit to the correlation circuit by converting the voltage signal to a digital signal.

24. An apparatus comprising:
a signal control circuit configured and arranged to provide a first control signal by combining a pseudo-random noise source carrying pseudo-random noise with a second control signal;
a voltage regulator circuit configured and arranged to output a voltage signal based on the first control signal;
an analog mixed-signal (AMS) circuit configured and arranged to process the voltage signal from the voltage regulator circuit by outputting a voltage signal as attenuated by a power supply rejection ration (PSRR) of the AMS circuit; and
a correlation circuit configured and arranged to self-test the AMS circuit by cross-correlating a signal indicative of the voltage signal from the AMS circuit with the pseudo-random noise, and, in response, by assessing results of the cross-correlation relative to a known threshold indicative of a performance level of the AMS circuit,
wherein the correlation circuit is configured and arranged to derive an impulse response of the AMS circuit from the cross-correlation, and determine the PSRR of the AMS circuit using the derived impulse response.

25. An apparatus comprising:
a signal control circuit configured and arranged to provide a first control signal by combining a pseudo-random noise source carrying pseudo-random noise with a second control signal;
a voltage regulator circuit configured and arranged to output a voltage signal based on the first control signal;
an analog mixed-signal (AMS) circuit configured and arranged to process the voltage signal from the voltage regulator circuit by outputting a voltage signal as attenuated by a power supply rejection ration (PSRR)

of the AMS circuit, the AMS circuit includes two pairs of field effect transistors arranged vertically between supply rails and configured and arranged to provide a differential amplifier; and
a correlation circuit configured and arranged to self-test the AMS circuit by cross-correlating a signal indicative of the voltage signal from the AMS circuit with the pseudo-random noise, and, in response, by assessing results of the cross-correlation relative to a known threshold indicative of a performance level of the AMS circuit.

26. An apparatus comprising:
a signal control circuit configured and arranged to provide a first control signal by combining a pseudo-random noise source carrying pseudo-random noise with a second control signal;
a voltage regulator circuit configured and arranged to output a voltage signal based on the first control signal, the voltage regulator circuit includes a programmable voltage generator configured with configurable bits that are changed in response to the first control signal, for changing a selection of transistors configured for controlling a variable resistor network;
an analog mixed-signal (AMS) circuit configured and arranged to process the voltage signal from the voltage regulator circuit by outputting a voltage signal as attenuated by a power supply rejection ration (PSRR) of the AMS circuit; and
a correlation circuit configured and arranged to self-test the AMS circuit by cross-correlating a signal indicative of the voltage signal from the AMS circuit with the pseudo-random noise, and, in response, by assessing results of the cross-correlation relative to a known threshold indicative of a performance level of the AMS circuit.

* * * * *